United States Patent
Peng et al.

[11] Patent Number: 5,933,052
[45] Date of Patent: Aug. 3, 1999

[54] OFFSET INSENSITIVE HYSTERESIS LIMITER

[75] Inventors: Yung-Chow Peng; Gwo-Shu Chiou, both of Hsinchu, Taiwan

[73] Assignee: Winbond Electronics Corp., Hsinchu, Taiwan

[21] Appl. No.: 08/954,944

[22] Filed: Oct. 22, 1997

[51] Int. Cl.[6] .............................. H03B 1/00; H03L 5/00
[52] U.S. Cl. ........................................... 327/554; 327/307
[58] Field of Search .................................. 327/554, 337, 327/307, 362, 552, 553, 205, 199

[56] References Cited

U.S. PATENT DOCUMENTS

| | | | |
|---|---|---|---|
| 4,492,927 | 1/1985 | Holberg | 327/307 |
| 4,543,534 | 9/1985 | Temes et al. | 331/9 |
| 4,616,145 | 10/1986 | Myers | 370/555 |
| 4,745,594 | 5/1988 | Takahashi | 370/308 |
| 5,124,593 | 6/1992 | Michel | 327/554 |
| 5,166,632 | 11/1992 | MacKenzie | 328/169 |
| 5,659,269 | 8/1997 | Myers | 327/557 |
| 5,774,004 | 6/1998 | Peng | 327/307 |

*Primary Examiner*—Toan Tran
*Attorney, Agent, or Firm*—Proskauer Rose LLP

[57] ABSTRACT

An offset-free switched capacitor circuit selectively operated by a non-overlapping two-phase clock signal for processing a frequency shift keying (FSK) input signal is provided. The switched capacitor circuit includes a filter which inputs a voltage signal for generating an output signal which assumes a first voltage value Vt1 at the first phase of the clock signal and assumes a second voltage value Vt2 at the second phase of the clock signal. The output signal of the switched capacitor circuit is an input to a succeeding hysteresis limiter. The hysteresis limiter, which receives the difference of Vt2 and Vt1, is operative to generate a logic signal which is HIGH when an input signal thereof exceeds a HIGH_ref signal and is LOW when the input signal thereof falls below a LOW_ref signal, and is so operated that the offset voltage associated with the amplifier therein is counterbalanced via internal operation.

7 Claims, 3 Drawing Sheets

OFFSET INSENSITIVE HYSTERESIS LIMITER

FIELD OF INVENTION

The present invention relates to a hysteresis limiter and more particularly to an offset-free hysteresis limiter in a signal processor.

BACKGROUND OF THE INVENTION

Hysteresis limiter has been widely used in the electronic device. For instance, in a frequency shift keying (FSK) receiver, the input signal is first processed by a front end filter followed by a hysteresis limiter. The front end filter, in typical, is embodied by a switched capacitor filter which is well known to occupy a smaller chip area. On the other hand, the implementation of hysteresis limiter comes from the requirement of noise immunity.

In a typical switched capacitor filter, an operational amplifier is implemented which usually generates an output signal with offset voltage. Also in the hysteresis limiter, an operational amplifier or a comparator is implemented which also generates an output signal with an offset voltage. In the following recitation, the term "amplifier" includes both the operational amplifier and the comparator. As the hysteresis limiter is provided to process the signal from the switched capacitor filter, the limiter encounters offset voltage itself and offset voltage with the input signal that is outputted from the switched capacitor filter. When the system's overall offset voltage caused by the switched capacitor filter and hysteresis limiter is larger than the resolution of the hysteresis limiter, the device malfunctions.

As a result, some prior arts teach techniques tackling to offset error either of the hysteresis limiter or the switched capacitor filter. In U.S. Pat. No. 4,616,145, an offset cancellation technique, which subtracts the selected signal by the offset voltage of the comparator, is disclosed to reduce the output error of the comparator. However, the offset of the input signal itself can not be canceled by the disclosed technique. In U.S. Pat. No. 4,543,534, an offset compensated switched capacitor circuit is disclosed to reduce the offset error within the front end filter. However, it is found out that using single-ended circuit in U.S. Pat. No. 4,543,534 may still have output offset concern regarding the charge rejection noise inherent with the single-ended circuit. Implementing fully-differential circuit in U.S. Pat. No. 4,543,534 may increase the overall circuit area substantially. In U.S. Pat. No. 5,166,632, the limiter circuit disclosed stores the offset error associated with the hysteresis limiter. However, the technique disclosed needs large RC value which may not be implemented on an integrated circuit.

It is therefore the main object of the invention to provide an alternative and simple approach to overcome the offset voltages in associated with the input signal to hysteresis limiter and the hysteresis limiter itself.

SUMMARY OF THE INVENTION

An offset-free switched capacitor circuit selectively operated by a non-overlapping two-phase clock signal for processing a frequency shift keying (FSK) input signal is provided. The switched capacitor circuit includes a first filter which inputs the FSK signal and generates a voltage signal. The switched capacitor circuit includes a second filter which inputs the voltage signal for generating an output signal which assumes a first voltage value Vt1 at the first phase of the clock signal and assumes a second voltage value Vt2 at the second phase of the clock signal. The output signal of the switched capacitor circuit is an input to a succeeding hysteresis limiter. The hysteresis limiter, inputting the value of (Vt2−Vt1) at the second phase of the clock signal, is operative to generate a logic signal which is HIGH when an input signal thereof exceeds a HIGH_ref signal and is LOW when the input signal thereof falls below a LOW_ref signal, and is so operated that the offset voltage associated with the operational amplifier therein is counterbalanced via internal operation.

BRIEF DESCRIPTIONS OF THE APPENDED DRAWINGS

DETAILED DESCRIPTION OF THE PREFERRED EMBODIMENTS

Figure 1:
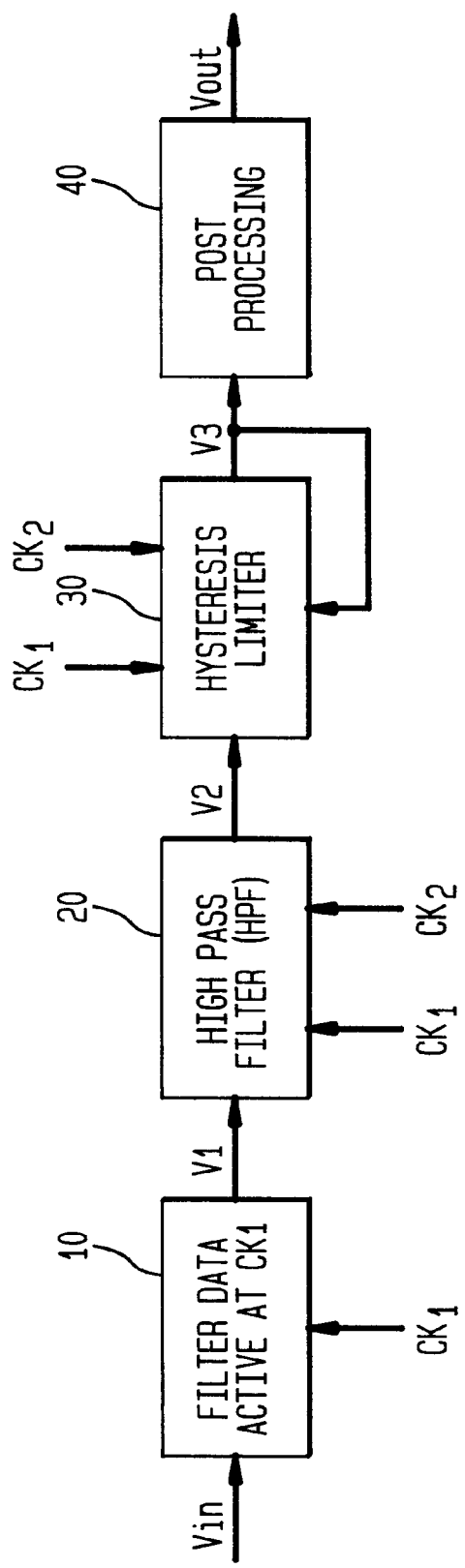
FIG. 1 shows the FSK signal processing system in block forms.

As shown in FIG. 1, a frequency shift keying (FSK) signal process system general includes a front end filter 10, a filter 20 which may be a high pass filter (HPF) or a band pass filter, a hysteresis limiter 30 and a post processing circuit 40. The input signal Vin is the FSK signal to be processed by the front end filter 10 which outputs a V1 signal which includes both the DC component and alternating current (AC) component. The filter 20 inputs the V1 signal, rejects the DC component and the out-of-band noise and generates V2 signal. The hysteresis limiter 30 is operative to generate a logic signal V3 which is HIGH when the input signal V2 exceeds a HIGH_ref signal, and which is LOW when the input signal V2 falls below a LOW_ref signal. All other successive processes, i.e. differentiator, rectifier or low pass filer circuits, applied to the signal V3 is denoted as the post processing circuit 40 in FIG. 1.

Figure 2:
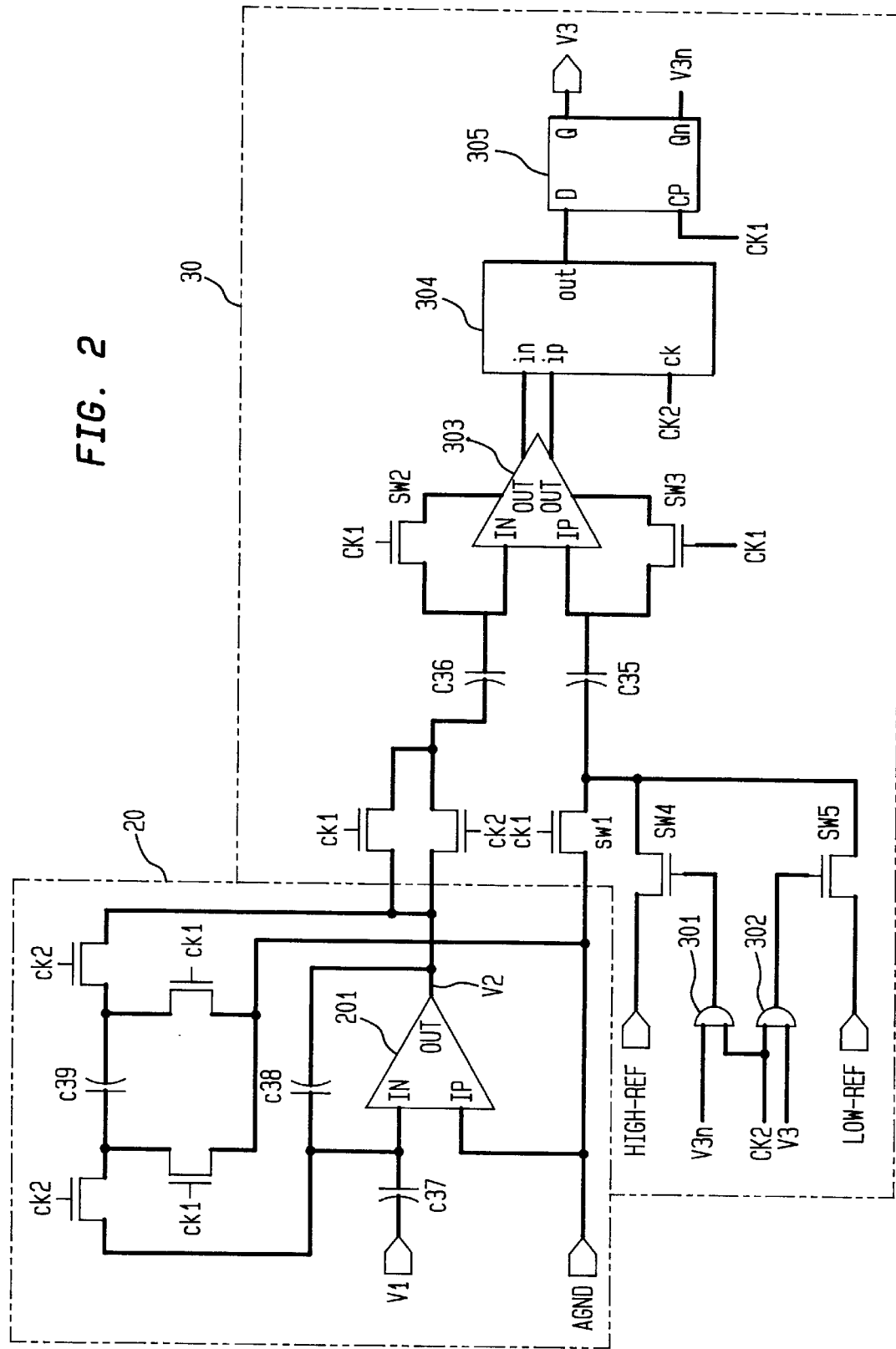
FIG. 2 shows the detailed schematics of the HPF 20 and the hysteresis limiter 30 of FIG. 1 according to the present invention.

As shown in FIG. 2, the HPF 20 of the invention, operated by a non-overlapping two-phase clock signal (CK1,CK2), inputs the voltage signal V1 to generate an output signal V2. This output signal V2 assumes a first voltage value V2t1 at the first phase (CK1) of the clock signal and assumes a second voltage value V2t2 at the second phase (CK2) of the clock signal. The purpose of this design is to cancel the adverse effect of offset voltage associated with the operation amplifier 201 within the HPF 20.

The HPF 20 includes an operational amplifier 201 having an inverting input, an non-inverting input, and an output generating the signal V2. The non-inverting input is adapted to receive the reference ground signal (AGND). The HPF 20 includes an input capacitor c37 having one node connected to the inverting input, and another node of the capacitor is adapted to receive the voltage signal V1 from the front end filter 10. The HPF 20 includes a first capacitor C38 disposed to form a first feedback loop of the operational amplifier 201 from the output thereof to the inverting input thereof. The HPF 20 includes a second capacitor C39 which is operated to form a second feedback loop of the operation amplifier 201 from the output thereof to the inverting input thereof during the second phase (CK2) of the clock signal. During the first phase (CK1) of the clock signal, the voltage across the capacitor C39, if any, will be discharged to the AGND. AGND is the reference ground for alternating current (AC) signal of the system. It is observed that V2 is equal to

[Vos−(m/k)V1$_{AC}$] at the first phase of the clock signal, and V2 is equal to [Vos−(m/(k+n))V1$_{AC}$] (hereinafter called Expression_1) at the second phase of the clock signal. Vos is the offset voltage associated with the operation amplifier 201. V1$_{AC}$ is the AC component of V1. The reference m is value of C37, k is value of C38, n is value of C39. Therefore, at the first phase of the clock signal, voltage value of V2t1=[Vos−(m/k)V1$_{AC}$] is applied to one node of the first input capacitor c36 of the downstream hysteresis limiter 30. And at the second phase of the clock signal, voltage value of V2t2=[Vos−(m/(k+n))V1$_{AC}$] is applied to the node of the first input capacitor c36 of the downstream hysteresis limiter 30. On the other hand, at the first phase of the clock signal, reference ground signal (AGND) is applied. to one node of the second input capacitor c35 of the hysteresis limiter 30. It is to be noted both V2t2 and V2t1 have offset error.

The hysteresis limiter 30 of the invention is operated by the first and second phase of the clock signal to generate the logic signal V3 such that offset voltage associated with the operational amplifier 303 is totally eliminated.

The hysteresis limiter 30 includes an input terminal, defined by the node of the capacitor c35, which receives an reference ground signal (AGND) at the first phase of the clock signal. This input terminal receives the LOW_ref signal at the second phase of the clock signal when the logic signal V3 at the output terminal is HIGH, and receives the HIGH_ref signal at the second phase of the clock signal when the logic signal V3 at the output terminal is LOW. This is the result of the operation of two AND gates 301, 302 which respectively inputs the V3n, V3 and CK2. The output of the AND gate 301 enables the corresponding SW4 and HIGH_ref signal is selected. The output of the AND gate 302 enables the corresponding SW5 and LOW_ref signal is selected. Only one of the SW4 and SW5 is enabled at the second phase of the clock signal. At the first phase of the clock signal, both the SW4 and SW5 are disabled.

The hysteresis limiter 30 includes an operational amplifier or a comparator 303 operated in a differential mode, a first input capacitor c36, a second input capacitor c35. The operational amplifier 303 has an inverting input(in), a non-inverting input(ip), a first output (outp) corresponding to the inverting input and a second output (outn) corresponding the non-inverting input. The first input capacitor c36 is used for capacitively coupling the output signal of the filter 20 to the inverting input of the operational amplifier 303. The second input capacitor c35 is used for capacitively coupling the output signal of the SW1, SW4 or SW5 to the non-inverting input of the operational amplifier 303. A SW2 is disposed to form a first feedback loop of the operational amplifier 303 from the first output thereof to the corresponding inverting input thereof during first phase of the clock signal. A SW3 is disposed to form a second feedback loop of the operational amplifier 303 from the second output thereof to the corresponding non-inverting input thereof during first phase of the clock signal. It is important to note that, at the first phase of the clock signal, the first input capacitor c36 stores voltage value of (V2t1−Vosh), wherein Vosh is the offset error with the operational amplifier 303. The value of Vosh stored at the CK1 phase is used to compensate the offset voltage incurred with the operational amplifier 303 operated at the CK2 phase of the clock signal.

The hysteresis limiter 30 further includes a latch 304 and a flip-flop 305. The latch 304 has a first input (in) connected to the first output of the operational amplifier 303, and has a second input (ip) connected to the second output of the operation amplifier 303. The latch 304 has a clock input receiving the second phase of the clock signal, and has an output terminal generating an latch value which indicates the difference between the first input and second input of the latch 304. Therefore, the comparison action of hysteresis limiter 30 is performed at the second phase of the clock signal. Also, the latch function of the latch 304 is completed at the second phase of the clock. The flip-flop 305 has a data input coupled to the output terminal of the latch 304, has a clock input receiving the first phase of the clock signal, and has an output terminal generating the logic signal V3. Therefore, the logic value V3 is outputted at a first phase clock following a previous second phase of the clock signal.

It is mentioned above that the first input capacitor c36 stores voltage of (V2t1−Vosh) at the first phase of the clock signal. At the immediate second phase of the clock signal, value of V2t2 (=[Vos−(m/(k+n))V1$_{AC}$]) is applied to one node of the first input capacitor c36 of the downstream hysteresis limiter 30. Therefore, at the second phase of the clock signal, signal seen by the inverting input of the operational amplifier 303 is V2t2−(V2t1−Vosh) [denoted as Expression_2 in the following]. The Vosh in Expression_2 functions to counterbalance the offset voltage Vosh of the operational amplifier 303 during the second phase of the clock signal such that the output at the first output terminal (outp) of the operational amplifier 303 is free of the offset error. Through manipulation, the Expression_2 may be rearranged as [(m*n*V1$_{AC}$/(k+n)*k)+Vosh] [denoted as Expression_3 in the following]. In other words, at the CK2 phase of the clock signal, value of Expression_3 is applied to the inverting input of the operational amplifier 303. Since the difference of (V2t2−V2t1) is free of the offset voltage associated with the operational amplifier 201, the corresponding input, i.e. V2t2−(V2t1−Vosh), to the inverting input of the operational amplifier 303, operated at the CK2 phase of the clock signal, is free of the offset error associated with the operational amplifier 201. Furthermore, the AC component of Expression_3 is linear function of V1$_{AC}$ such that no nonlinear distortion is introduced.

Comparing the Expression_3 with the Expression_1, it is noted that a scale factor of n/k is involved when the Expression_3 is used to emulate the V2 signal. Therefore, when setting the HIGH_ref and LOW_ref value, the scale factor of n/k must be reflected.

Assume V3 is logic HIGH, at the second phase of the clock signal, the value of voltage seen by the non-inverting input of the operational amplifier 303 is (LOW_ref-AGND). Similarly, as V3 is logic LOW, at the second phase of the clock signal, the value of voltage seen by the non-inverting input of the operational amplifier 303 is (HIGH_ref-AGND).

The comparison results (outp, outn) of the operational amplifier 303 at the second phase of the clock signal is a fully-differential signal. The values at the inverting input and non-inverting input of the operational amplifier 303 are [(m*n*V1$_{AC}$/(k+n)*k)+Vosh] and (HIGH_ref-AGND) respectively at the second phase of the clock signal, as V3 is logic LOW. The values at the inverting input and non-inverting input of the operational amplifier 303 are [(m*n*V1$_{AC}$/(k+n)*k)+Vosh] and (LOW_ref-AGND) respectively at the second phase of the clock signal, as V3 is logic HIGH. The offset voltage Vosh between the inverting input and non-inverting input of the operational amplifier 303 will counterbalance the internal offset of the operational amplifier 303. The latch 304 receives this differential signal and outputs a logic HIGH or LOW signal at its output terminal at the second phase of the clock signal. The flip-flop 305 then at the next first phase of the clock signal outputs its corresponding V3 signal.

Figure 3:
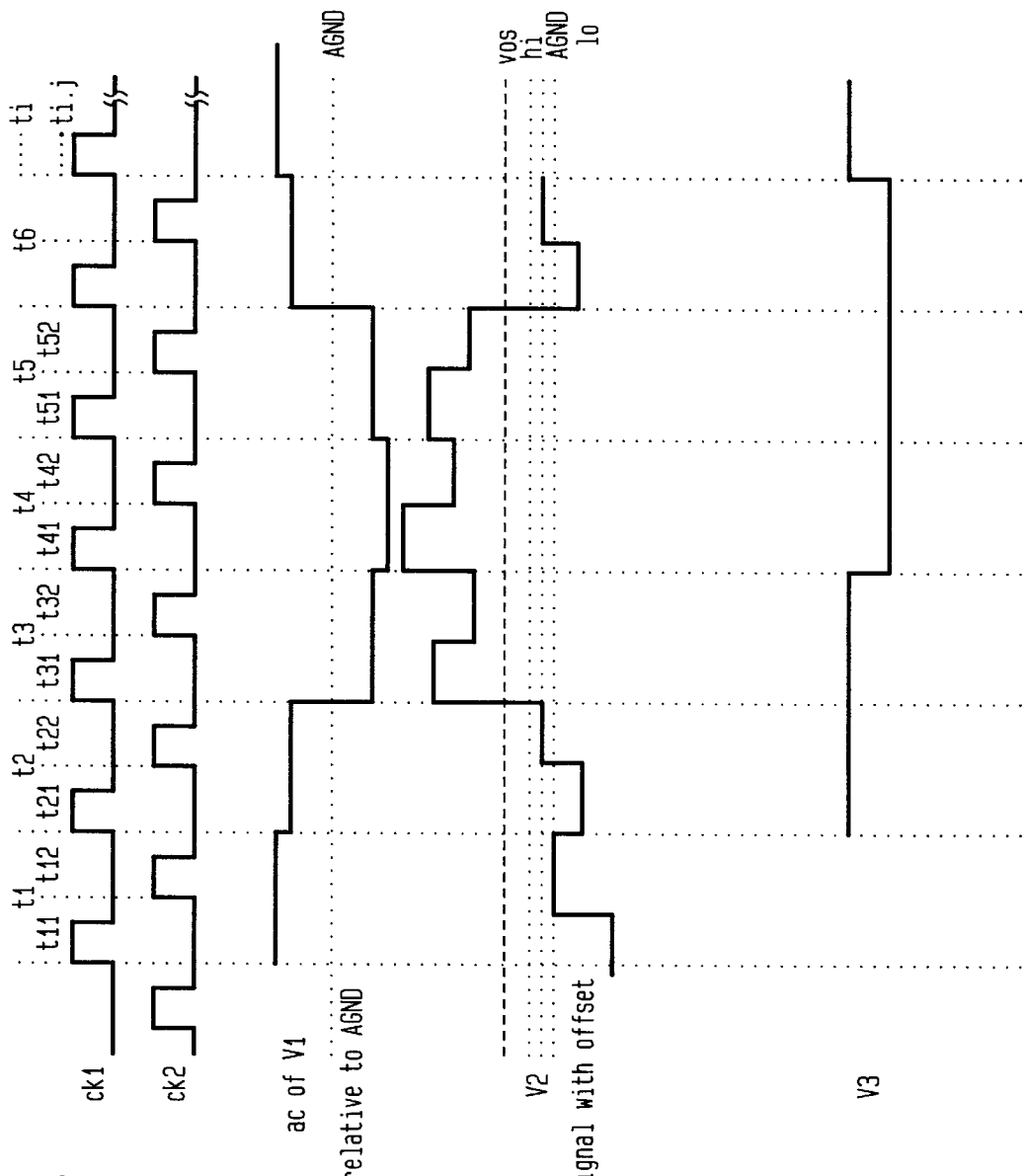
FIG. 3 shows the forms of the output signals V1, V2 and V3 in FIG. 2.

The above descriptions may be further understood by referencing the respective signals of FIG. 2 shown in FIG. 3. The signals in FIG. 3 are obtained when m=2 pF, n=k=1 pF. In FIG. 3, the V1 signal shown is only the AC component relative to the AGND. The shown V2 signal which includes the offset voltage of the operational amplifier 201 is the output signal of the high pass filter 20 at different time slots. However, due to the operation of the filter 20 at different time slots and the arrangement of the hysteresis limiter 30, the output signal V3 is obtained with all offset effects associated with the operational amplifier being eliminated.

We claim:

1. An offset-free switched capacitor circuit selectively operated by a non-overlapping two-phase clock signal, the clock signal including a first phase and a second phase, comprising:

a filter, inputting a voltage signal, for generating an output signal which assumes a first voltage value Vt1 at the first phase of the clock signal and assumes a second voltage value Vt2 at the second phase of the clock signal;

a hysteresis limiter operative to generate a logic signal which is HIGH when an input signal thereof exceeds a HIGH_ref signal and is LOW when the input signal thereof falls below a LOW_ref signal, the hysteresis limiter having an output terminal generating said logic signal, having a first input terminal receiving said output signal of the filter, having a second input terminal which receives an reference ground signal (AGND) at the first phase of the clock signal, receives the LOW_ref signal at the second phase of the clock signal when the logic signal at the output terminal is HIGH, and receives the HIGH_ref signal at the second phase of the clock signal when the logic signal at the output terminal is LOW.

2. The offset-free switched capacitor circuit of claim 1, wherein the filter is a high pass filter (HPF).

3. The offset-free switched capacitor circuit of claim 2, wherein the HPF comprises:

an amplifier having an inverting input, an non-inverting input, and an output generating said output signal of the HPF, the non-inverting input adapted to receive the reference ground signal;

an input capacitor having one node connected to the inverting input, and another node adapted to receive the voltage signal;

a first capacitor disposed to form a first feedback loop of the HPF from the output thereof to the inverting input thereof; and a second capacitor operated to form a second feedback loop of the HPF from the output thereof to the inverting input thereof during the second phase of the clock signal.

4. The offset-free switched capacitor circuit of claim 1, wherein the hysteresis limiter comprises:

a logic circuit having an output terminal transmitting an output signal which assumes the LOW_ref signal at the second phase of the clock signal when the logic signal at the output terminal of the hysteresis limiter is HIGH, and assumes the HIGH_ref signal at the second phase of the clock signal when the logic signal at the output terminal of the hysteresis limiter is LOW;

a first switch means having an output terminal selectively outputting the reference ground signal and the output signal of the logic circuit;

an amplifier having an inverting input, a non-inverting input, a first output and a second output, an output differential signal between the first output and the second output having an offset error of Vosh;

a first input capacitor for capacitively coupling the output signal of the filter to the inverting input of the amplifier;

a second input capacitor for capacitively coupling the output terminal of the first switch means to the non-inverting input of the amplifier;

a second switch means disposed to form a first feedback loop of the amplifier from the first output thereof to the inverting input thereof during first phase of the clock signal;

a third switch means disposed to form a second feedback loop of the amplifier from the second output thereof to the non-inverting input thereof during first phase of the clock signal;

wherein the first input capacitor stores voltage of (Vt1−Vosh) at the first phase of the clock signal and the second input capacitor stores voltage of AGND at the first phase of the clock signal.

5. The offset-free switched capacitor circuit of claim 4, wherein the hysteresis limiter further comprises:

a latch means, having a first input connected to the first output of the amplifier, a second input connected to the second output of the operation amplifier, a clock input receiving the second phase of the clock signal, and an output terminal generating an latch value indicative of difference between the first input and second input of the latch means; and a flip-flop, having a data input coupled to the output terminal of the latch means, a clock input receiving the first phase of the clock signal, and an output terminal generating the logic signal of the hysteresis limiter.

6. The offset-free switched capacitor circuit of claim 4, wherein the logic circuit comprises:

a first AND gate having a first input and a second input, the first input receiving an inverted value of the logic signal of the hysteresis limiter, the second input adapted to receive the second phase of the clock signal, the first AND gate having an output generating a first control signal;

a second AND gate having a first input and a second input, the first input receiving the logic signal of the hysteresis limiter, the second input adapted to receive the second phase of the clock signal, the second AND gate having an output generating a second control signal;

a fourth switch means operated by the first control signal for selectively transmitting HIGH_ref signal as the output signal of the logic circuit;

a fifth switch means operated by the second control signal for selectively transmitting LOW_ref signal as the output signal of the logic circuit.

7. The offset-free switched capacitor circuit of claim 1, wherein the offset-free switched capacitor circuit is operative to process a frequency shift keying (FSK) input signal, and further comprises a front end filter which, responsive to the FSK input signal, generates the voltage signal.

* * * * *